(12) United States Patent
Lee et al.

(10) Patent No.: US 12,695,443 B2
(45) Date of Patent: Jul. 28, 2026

(54) SENSE AMPLIFIER FLIP-FLOP AND INTEGRATED CIRCUIT INCLUDING THE SAME

(71) Applicant: SAMSUNG ELECTRONICS CO., LTD., Suwon-si (KR)

(72) Inventors: Jaeha Lee, Suwon-si (KR); Bai-sun Kong, Suwon-si (KR); Bomin Joo, Suwon-si (KR)

(73) Assignees: Samsung Electronics Co., Ltd., Suwon-si (KR); Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 18/812,235

(22) Filed: Aug. 22, 2024

(65) Prior Publication Data

US 2025/0070764 A1 Feb. 27, 2025

(30) Foreign Application Priority Data

Aug. 23, 2023 (KR) ........................ 10-2023-0110792
Dec. 18, 2023 (KR) ........................ 10-2023-0185068

(51) Int. Cl.
*H03K 3/356* (2006.01)
*G11C 7/06* (2006.01)

(52) U.S. Cl.
CPC .......... *H03K 3/356113* (2013.01); *G11C 7/06* (2013.01)

(58) Field of Classification Search
CPC .......... H03K 3/02; H03K 3/353; H03K 3/356; H03K 3/356086; H03K 3/356095; H03K 3/356104; H03K 3/356113; H03K 3/356121; H03K 3/35613; H03K 3/356139; H03K 3/3562; H03K 3/35625; H03K 5/22; H03K 5/24; H03K 5/2472; H03K 5/2481; H03K 5/249; G11C 7/06; G11C 7/062; G11C 7/065
See application file for complete search history.

(56) References Cited

U.S. PATENT DOCUMENTS

| | | |
|---|---|---|
| 7,439,775 B2 | 10/2008 | Sohn |
| 7,692,466 B2 | 4/2010 | Ahmadi |
| (Continued) | | |

FOREIGN PATENT DOCUMENTS

KR 10-2006-0114055 11/2006

OTHER PUBLICATIONS

Jeong et al., "Self-Timed Pulsed Latch for Low-Voltage Operation With Reduced Hold Time, " IEEE Journal of Solid-State Circuits, Aug. 2019, 54(8):2304-2315.

(Continued)

*Primary Examiner* — Long Nguyen
(74) *Attorney, Agent, or Firm* — Fish & Richardson P.C.

(57) ABSTRACT

A sense amplifier flip-flop includes a first stage configured to generate, in response to a rising edge of a clock signal, a first latch signal and a second latch signal by pulling down a first pull-down node or a second pull-down node according to a data input and an inverted data input, wherein the first stage includes a bridge circuit configured to electrically connect the first pull-down node and the second pull-down node to each other in response to an activated bridge signal, and a control circuit configured to activate the bridge signal when the data input transitions while the clock signal is logic high.

19 Claims, 12 Drawing Sheets

(56) References Cited

U.S. PATENT DOCUMENTS

| | | | |
|---|---|---|---|
| 7,768,320 B1 | 8/2010 | Yang et al. | |
| 7,772,891 B1 | 8/2010 | Yang et al. | |
| 8,824,215 B2 * | 9/2014 | Frederick, Jr. ........... | G11C 7/12 |
| | | | 365/189.05 |
| 10,566,959 B1 | 2/2020 | Mittal et al. | |
| 2006/0244502 A1 | 11/2006 | Kim | |
| 2016/0380753 A1 | 12/2016 | Dudulwar et al. | |

OTHER PUBLICATIONS

Jeong et al., "Sense-Amplifier-Based Flip-Flop With Transition Completion Detection for Low-Voltage Operation," IEEE Transactions on Very Large Scale Integration (VLSI) Systems, Apr. 2018, vol. 26, No. 4, 13 pages.
Naffziger et al., "The Implementation of the Itanium 2 Microprocessor," IEEE Journal of Solid-State Circuits, Nov. 2002, 37(11):1448-1460.
Nikolic et al., "Improved Sense-Amplifier-Based Flip-Flop: Design and Measurements," IEEE Journal of Solid-State Circuits, Jun. 2000, 35(6):876-884.
Seng et al., "New Conditional Sampling Sense-Amplifier-Based Flip-Flop for High-Performance and Low-Power Application," 2007 International Symposium on Integrated Circuits, 2007, pp. 204-207.
Shah et al., "Improved Sense Amplifier Based Flip Flop Design for Low Power and High Data Activity Circuits," Journal of Applied Science and Engineering, Oct. 2022, 2022, 26(7):1045-1051.

* cited by examiner

SENSE AMPLIFIER FLIP-FLOP AND INTEGRATED CIRCUIT INCLUDING THE SAME

CROSS-REFERENCE TO RELATED APPLICATIONS

This application is based on and claims priority under 35 U.S.C. § 119 to Korean Patent Application Nos. 10-2023-0110792, filed on Aug. 23, 2023, and 10-2023-0185068, filed on Dec. 18, 2023, in the Korean Intellectual Property Office, the disclosures of which are incorporated by reference herein in their entireties.

BACKGROUND

An integrated circuit that processes a digital signal may include flip-flops. A flip-flop may latch an input based on a clock signal and output the latched input. The flip-flop may include transistors and may have various structures according to applications. According to the requirements for an integrated circuit, a flip-flop designed to have a high operating speed may consume high power. The power consumption of the integrated circuit may depend on the power consumption of the flip-flop, and accordingly, a flip-flop having a high operating speed and reduced power consumption may be required.

SUMMARY

The disclosure provides a sense amplifier flip-flop having a high operating speed and reduced power consumption and an integrated circuit including the same.

According to an aspect of the disclosure, there is provided a sense amplifier flip-flop including a first stage configured to generate, in response to a rising edge of a clock signal, a first latch signal and a second latch signal by pulling down a first pull-down node or a second pull-down node according to a data input and an inverted data input, and a second stage configured to generate a data output based on the first latch signal and the second latch signal, wherein the first stage includes a bridge circuit configured to electrically connect the first pull-down node and the second pull-down node to each other in response to an activated bridge signal, and a control circuit configured to activate the bridge signal when the data input transitions while the clock signal is logic high.

According to another aspect of the disclosure, there is provided a sense amplifier flip-flop including a first stage configured to generate, in response to a rising edge of a clock signal, a first latch signal and a second latch signal by pulling down a first pull-down node or a second pull-down node according to a data input and an inverted data input, and a second stage configured to generate a data output based on the first latch signal and the second latch signal, wherein the first stage is configured to electrically connect the first pull-down node and the second pull-down node to each other when the data input transitions while the clock signal is logic high.

According to another aspect of the disclosure, there is provided a method of generating a data output by latching a data input based on a clock signal including generating, in response to a rising edge of the clock signal, a first latch signal and a second latch signal by pulling down a first pull-down node or a second pull-down node according to the data input and an inverted data input, and generating the data output based on the first latch signal and the second latch signal, wherein the generating of the first latch signal and the second latch signal includes detecting a transition of the data input while the clock signal is logic high, and electrically connecting the first pull-down node and the second pull-down node to each other when the transition of the data input is detected.

BRIEF DESCRIPTION OF THE DRAWINGS

Implementations will be more clearly understood from the following detailed description taken in conjunction with the accompanying drawings in which.

DETAILED DESCRIPTION

Figure 1:
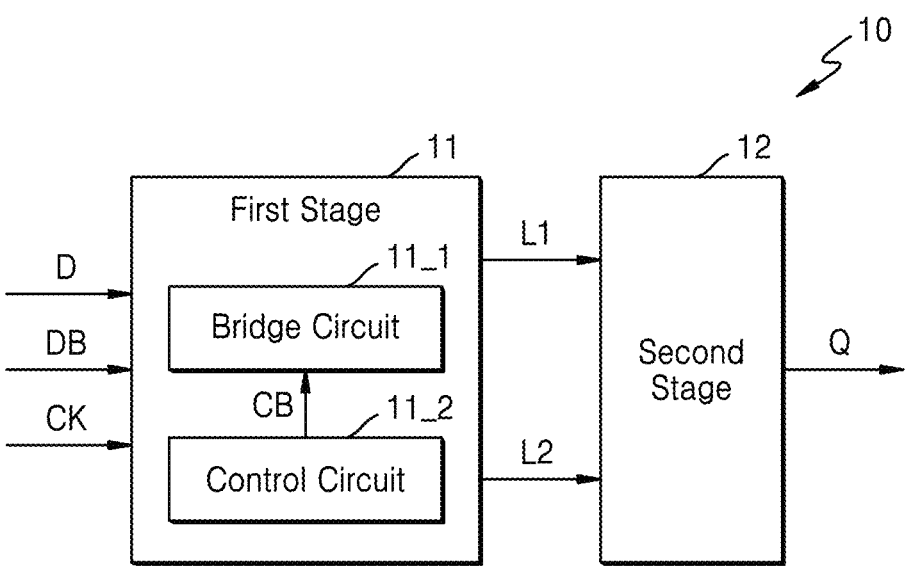
FIG. 1 is a block diagram illustrating a flip-flop according to some implementations.

FIG. 1 is a block diagram illustrating a flip-flop 10 according to some implementations. In some implementations, the flip-flop 10 may be included in an integrated circuit manufactured by a semiconductor process. As shown in FIG. 1, the flip-flop 10 includes a first stage 11 and a second stage 12. Herein, unless otherwise specified, it is assumed that signals are active-high signals with logic high when activated and logic low when deactivated, but it is noted that implementations, are not limited thereto. Herein, logic high may correspond to a positive supply voltage VDD and may be expressed as '1'. In addition, logic low may correspond to a negative supply voltage VSS and may be expressed as '0'.

As shown in FIG. 1, the flip-flop 10 may latch a data input D based on a clock signal CK and generate a data output Q corresponding to the latched data input D. In some implementations, the flip-flop 10 may be of a single-ended type, and an inverted data input DB may be generated from the data input D by an inverter included in the flip-flop 10. In some implementations, the flip-flop 10 may be of a differential type and may receive the data input D and the inverted data input DB, and generate the data output Q and an inverted data output (e.g. QB in FIG. 2). The flip-flop 10 may be a positive edge triggered flip-flop that latches the data input D in response to a rising edge of the clock signal CK, or a negative edge triggered flip-flop that latches the data input D in response to a falling edge of the clock signal CK. Herein, the flip-flop 10 is assumed to be a positive edge triggered flip-flop, but it is noted that implementations are not limited thereto.

The first stage 11 may receive the data input D and the clock signal CK, and generate a first latch signal L1 and a second latch signal L2. In some implementations, the first stage 11 may generate the first latch signal L1 and the second latch signal L2 by pulling down a first pull-down node or a second pull-down node according to the data input D and the inverted data input DB. For example, as will be described below with reference to FIG. 3, the first stage 11 may include a sense amplifier structure, pull down the first pull-down node or the second pull-down node according to the data input D and the inverted data input DB in response to the rising edge of the clock signal CK, and generate first latch signal L1 and second latch signal L2 which are complementary to each other. As such, the flip-flop 10 including the sense amplifier structure may be referred to as a sense amplifier flip-flop (SAFF).

As shown in FIG. 1, the first stage 11 includes a bridge circuit 11_1 and a control circuit 11_2. The bridge circuit 11_1 may be connected to the first pull-down node and the second pull-down node that are pulled down according to the data input D and the inverted data input DB in the first stage 11. As will be described below with reference to FIG. 3, voltages of the first pull-down node and the second pull-down node may be pulled down depending on the data input D and the inverted data input DB after a current path is formed by the clock signal CK, and accordingly, the first latch signal L1 and the second latch signal L2 may vary according to changes in the data input D and the inverted data input DB in a hold period. As shown in FIG. 1, the bridge circuit 11_1 may receive a bridge signal CB from the control circuit 11_2, and electrically connect the first pull-down node to the second pull-down node in response to the activated bridge signal CB, thereby preventing changes of the first latch signal L1 and the second latch signal L2.

The control circuit 11_2 may generate the bridge signal CB provided to the bridge circuit 11_1. When the bridge circuit 11_1 always electrically connects the first pull-down node and the second pull-down node to each other, that is, when the bridge signal CB that is always activated is provided to the bridge circuit 11_1, current paths may be formed in both the first pull-down node and the second pull-down node at the rising edge of the clock signal CK, and accordingly, a sampling error of the data input D may occur. In addition, when the bridge signal CB is synchronized with the clock signal CK or both the first latch signal L1 and the second latch signal L2 regardless of the data input D, the bridge signal CB may be toggled for each cycle of the clock signal CK, and unnecessary power consumption may occur. As will be described below with reference to the drawings, the control circuit 11_2 may generate the activated bridge signal CB when the data input D (or the inverted data input DB) transitions while the clock signal CK is logic high. Accordingly, the first pull-down node and the second pull-down node may be electrically connected to each other only when necessary by the bridge circuit 11_1, and the flip-flop 10 may have not only high operation reliability but also reduced power consumption.

The second stage 12 may receive the first latch signal L1 and the second latch signal L2 from the first stage 11 and generate the data output Q. In some implementations, as described below with reference to FIGS. 6 and 7, the second stage 12 may further receive not only the first latch signal L1 and the second latch signal L2 but also at least one of the clock signal CK, the data input D, or the inverted data input DB. Examples of the second stage 12 will be described below with reference to FIGS. 2, 6 and 7.

Figure 2:
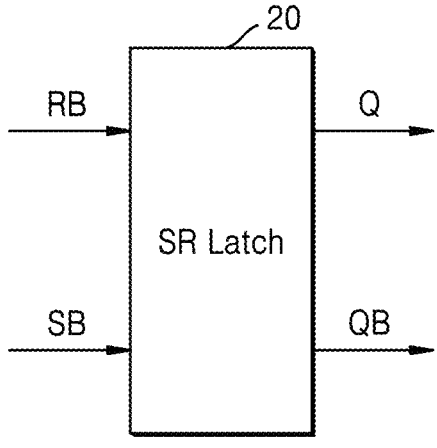
FIG. 2 is a block diagram illustrating a second stage of a flip-flop according to some implementations.

FIG. 2 is a block diagram illustrating a second stage of a flip-flop according to some implementations. For example, the block diagram of FIG. 2 shows an SR latch 20 as an example of the second stage 12 of FIG. 1. Hereinafter, FIG. 2 will be explained with reference to FIG. 1.

In some implementations, the second stage 12 includes an SR latch 20. For example, the first latch signal L1 may correspond to an inverted reset signal RB, and the second latch signal L2 may correspond to an inverted set signal SB. When the inverted reset signal RB is 1 and the inverted set signal SB is 0 (RB=1, SB=0), the SR latch 20 may generate the data output Q which is 1 and the inverted data output QB which is 0 (Q=1, QB=0). When the inverted reset signal RB is 0 and the inverted set signal SB is 1 (RB=0, SB=1), the SR latch 20 may generate the data output Q which is 0 and the inverted data output QB which is 1 (Q=0, QB=1). When the inverted reset signal RB is 1 and the inverted set signal SB is 1 (RB=1, SB=1), the SR latch 20 may hold the data output Q and the inverted data output QB.

Figure 3:
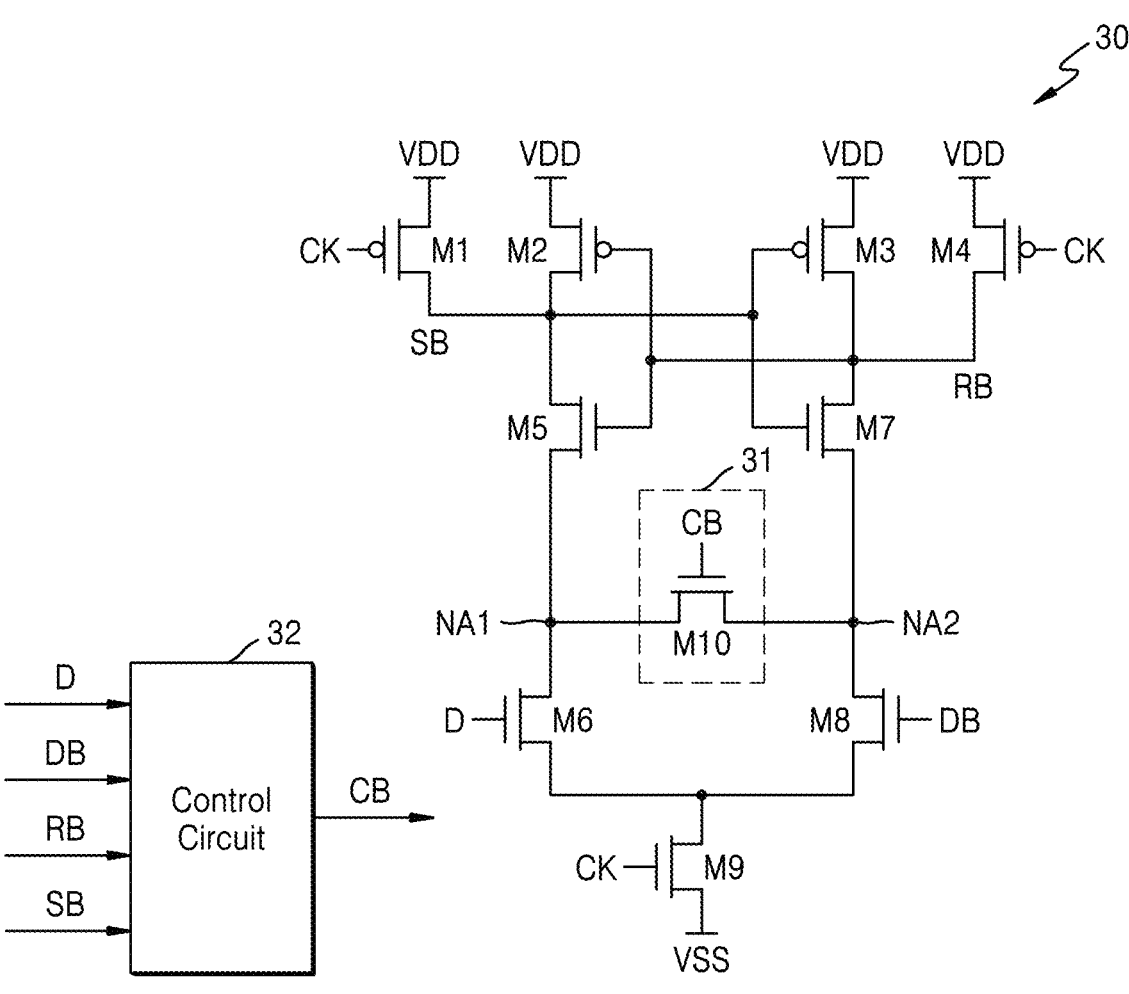
FIG. 3 is a circuit diagram illustrating a first stage of a flip-flop according to some implementations.

FIG. 3 is a circuit diagram illustrating a first stage 30 of a flip-flop according to some implementations. For example, the circuit diagram of FIG. 3 shows the first stage 30 generating the inverted reset signal RB and the inverted set signal SB as the first latch signal L1 and the second latch signal L2 of FIG. 1. As shown in FIG. 3, the first stage 30 includes first to ninth transistors M1 to M9, a bridge circuit 31, and a control circuit 32. The first to fourth transistors M1 to M4 may be p-channel field effect transistors (PFETs), and the fifth to ninth transistors M5 to M9 may be n-channel field effect transistors (NFETs). FIG. 3 will be explained below with reference to FIGS. 1 and 2.

As described above with reference to FIG. 1, the first stage 30 may generate the inverted reset signal RB and the inverted set signal SB by pulling down the first pull-down node or the second pull-down node according to the data input D and the inverted data input DB. Referring to FIG. 3, a sixth transistor M6 and an eighth transistor M8 may receive the data input D and the inverted data input DB, respectively, and may have sources connected to a drain of a ninth transistor M9 receiving the clock signal CK, respectively. The second transistor M2, the third transistor M3, the fifth transistor M5, and the seventh transistor M7 may correspond to two inverters which are cross-coupled. The first transistor M1 and the fourth transistor M4, which receive the clock signal CK, may be respectively connected to nodes to which the two inverters are connected. Each of the first transistor M1 to the fourth transistor M4 may have a source connected to a node (herein referred to as a first power node) to which the positive supply voltage VDD is applied. The ninth transistor M9 may have a source connected to a node (herein referred to as a second power node) to which the negative supply voltage VSS is applied.

The bridge circuit 31 may be connected to a first pull-down node NA1 and a second pull-down node NA2. As shown in FIG. 3, the first pull-down node NA1 may correspond to a drain of the sixth transistor M6 receiving the data input D, and the second pull-down node NA2 may correspond to a drain of the eighth transistor M8 receiving the inverted data input DB. As shown in FIG. 3, the bridge circuit 31 includes a tenth transistor M10 that is an NFET, and the tenth transistor M10 may have a gate receiving the bridge signal CB. Accordingly, the bridge circuit 31 may electrically connect the first pull-down node NA1 and the second pull-down node NA2 to each other in response to the activated bridge signal CB, that is, the bridge signal CB that is logic high.

The control circuit 32 may generate the bridge signal CB based on the data input D, the inverted data input DB, the inverted reset signal RB, and the inverted set signal SB. As described above with reference to FIG. 1, in order to generate the bridge signal CB that is activated when the data input D transitions while the clock signal CK is logic high, the control circuit 32 may receive the data input D, the inverted data input DB, the inverted reset signal RB, and the inverted set signal SB, and generate the bridge signal CB. Examples of the control circuit 32 will be described below with reference to FIGS. 5A, 5B, 6, and 7.

Figure 4:
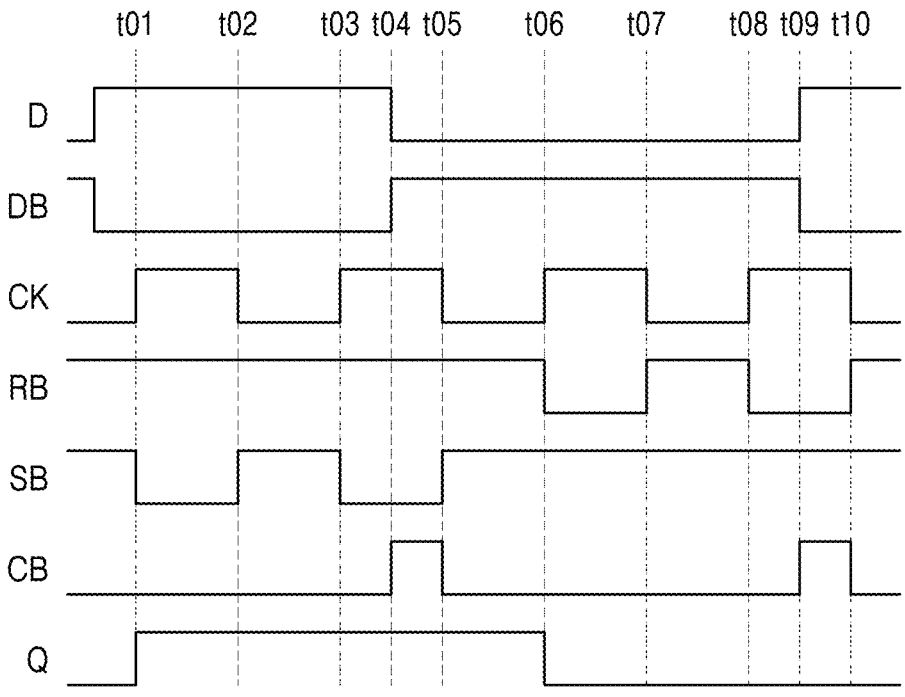
FIG. 4 is a timing diagram illustrating signals of a flip-flop according to some implementations.

FIG. 4 is a timing diagram illustrating an operation of a flip-flop according to some implementations. For example, the timing diagram in FIG. 4 shows the data input D, the inverted data input DB, the clock signal CK, the inverted reset signal RB, the inverted set signal SB, the bridge signal CB, and the data output Q over time. Hereinafter, FIG. 4 will be explained with reference to FIGS. 2 and 3.

Referring to FIG. 4, the clock signal CK may be 0 before time t01. Due to the clock signal CK being 0, the ninth transistor M9 may be turned off, and accordingly, a path of current flowing through the negative supply voltage VSS may be blocked. In addition, due to the clock signal CK being 0, the first transistor M1 and the fourth transistor M4 may be turned on, and accordingly, as shown in FIG. 4, the inverted reset signal RB and the inverted set signal SB may be precharged to 1 (for example, transition to logic high). As shown in FIG. 4, the bridge signal CB may be 0, and accordingly, the bridge circuit 31 may electrically disconnect the first pull-down node NA1 and the second pull-down node NA2 from each other.

At the time t01, a rising edge of the clock signal CK may occur. Due to the rising edge of the clock signal CK, the ninth transistor M9 may be turned on, and the first transistor M1 and the fourth transistor M4 may be turned off. Accordingly, the first stage 30 may operate similarly to a sense amplifier. As shown in FIG. 4, due to the data input D being 1 and the inverted data input DB being 0 at the time t01, the inverted reset signal RB may hold 1 while the inverted set signal SB may transition to 0 due to the current path including the first pull-down node NA1 which is pulled down. Accordingly, the SR latch 20 may generate the data output Q that is 1. The bridge signal CB may hold 0, and accordingly, the bridge circuit 31 may electrically disconnect the first pull-down node NA1 and the second pull-down node NA2 from each other.

At time t02, the falling edge of the clock signal CK may occur. Due to the falling edge of the clock signal CK, the ninth transistor M9 may be turned off, and the first transistor M1 and the fourth transistor M4 may be turned on. Accordingly, the inverted reset signal RB and the inverted set signal SB may be precharged to 1, and the SR latch 20 may hold the data output Q.

At time t03, the rising edge of the clock signal CK may occur. Due to the rising edge of the clock signal CK, the ninth transistor M9 may be turned on, and the first transistor M1 and the fourth transistor M4 may be turned off. Accordingly, the first stage 30 may operate similarly to a sense amplifier. As shown in FIG. 4, due to the data input D being 1 and the inverted data input DB being 0 at the time t03, the inverted reset signal RB may be held at 1 while the inverted set signal SB may transition to 0 due to the current path including the first pull-down node NA1 which is pulled down. Accordingly, the SR latch 20 may generate the data output Q that is 1. The bridge signal CB may hold 0, and accordingly, the bridge circuit 31 may electrically disconnect the first pull-down node NA1 and the second pull-down node NA2 from each other.

At time t04, the data input D and the inverted data input DB may transition. When the bridge circuit 31 is omitted, because the clock signal CK is 1, the inverted reset signal RB and the inverted set signal SB may also transition according to the transitioned data input D and inverted data input DB. In order to prevent transition of the inverted reset signal RB and the inverted set signal SB, the bridge signal CB may be 1, and accordingly the bridge circuit 31 may electrically connect the first pull-down node NA1 and the second pull-down node NA2 to each other. Accordingly, the first stage 30 may not operate as a sense amplifier even though the clock signal CK is 1, and as shown in FIG. 4, the inverted reset signal RB and the inverted set signal SB may be held.

At time t05, the falling edge of the clock signal CK may occur. Due to the falling edge of the clock signal CK, the ninth transistor M9 may be turned off, and the first transistor M1 and the fourth transistor M4 may be turned on. Accordingly, the inverted reset signal RB and the inverted set signal SB may be precharged to 1, and the SR latch 20 may hold the data output Q. In addition, the bridge signal CB may transition back to 0.

At time t06, the rising edge of the clock signal CK may occur. Due to the rising edge of the clock signal CK, the ninth transistor M9 may be turned on, and the first transistor M1 and the fourth transistor M4 may be turned off. Accordingly, the first stage 30 may operate similarly to a sense amplifier. As shown in FIG. 4, due to the data input D being 0 and the inverted data input DB being 1 at the time t06, the inverted set signal SB may be held at 1 while the inverted reset signal RB may transition to 0 due to the current path including the second pull-down node NA2 which is pulled down. Accordingly, the SR latch 20 may generate the data output Q of 0. The bridge signal CB may hold 0, and accordingly, the bridge circuit 31 may electrically disconnect the first pull-down node NA1 and the second pull-down node NA2 from each other.

At time t07, the falling edge of the clock signal CK may occur. Due to the falling edge of the clock signal CK, the ninth transistor M9 may be turned off, and the first transistor M1 and the fourth transistor M4 may be turned on. Accordingly, the inverted reset signal RB and the inverted set signal SB may be precharged to 1, and the SR latch 20 may hold the data output Q.

At time t08, the rising edge of the clock signal CK may occur. Due to the rising edge of the clock signal CK, the ninth transistor M9 may be turned on, and the first transistor M1 and the fourth transistor M4 may be turned off. Accordingly, the first stage 30 may operate similarly to a sense amplifier. As shown in FIG. 4, due to the data input D being 0 and the inverted data input DB being 1 at time t08, the inverted set signal SB may be held at 1 while the inverted reset signal RB may transition to 0 due to the current path including the second pull-down node NA2 which is pulled down. Accordingly, the SR latch 20 may generate the data output Q of 0. The bridge signal CB may hold 0, and accordingly, the bridge circuit 31 may electrically disconnect the first pull-down node NA1 and the second pull-down node NA2 from each other.

At time t09, the data input D and the inverted data input DB may transition. In order to prevent transition of the inverted reset signal RB and the inverted set signal SB, the bridge signal CB may be 1, and accordingly, the bridge circuit 31 may electrically connect the first pull-down node NA1 and the second pull-down node NA2 to each other. Accordingly, the first stage 30 may not operate as a sense amplifier even though the clock signal CK is 1, and as shown in FIG. 4, the inverted reset signal RB and the inverted set signal SB may be held.

At time t10, the falling edge of the clock signal CK may occur. Due to the falling edge of the clock signal CK, the ninth transistor M9 may be turned off, and the first transistor M1 and the fourth transistor M4 may be turned on. Accordingly, the inverted reset signal RB and the inverted set signal SB may be precharged to 1, and the SR latch 20 may hold the data output Q. In addition, the bridge signal CB may transition back to 0.

Figure 5A:
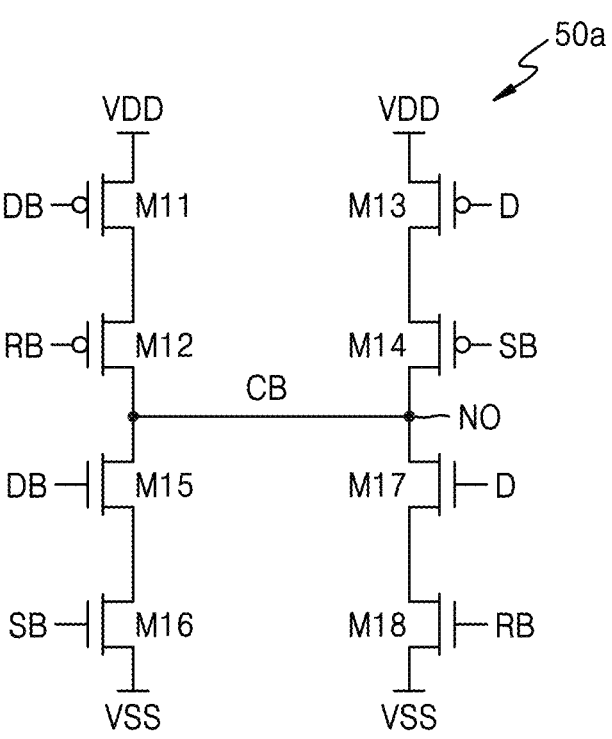
FIGS. 5A and 5B are circuit diagrams illustrating examples of control circuits according to some implementations.
Figure 5B:
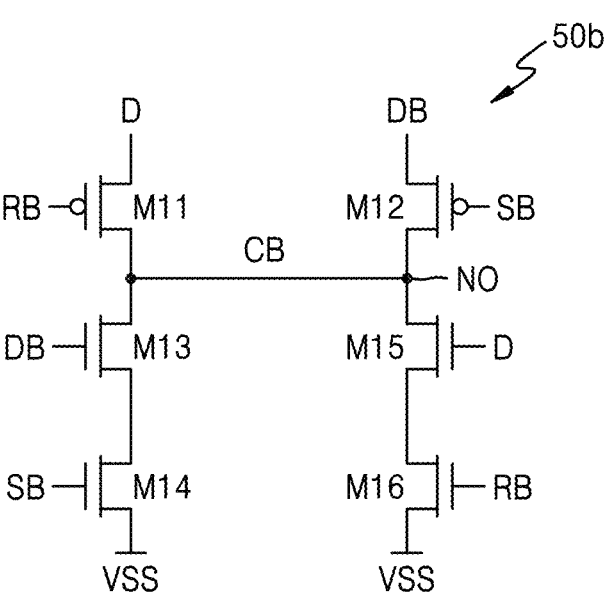

FIGS. 5A and 5B are circuit diagrams illustrating examples of control circuits 50a and 50b, respectively, according to some implementations. As described above with reference to FIG. 3, the control circuits 50a and 50b may each generate the bridge signal CB based on the data input D, the inverted data input DB, the inverted reset signal RB, and the inverted set signal SB.

Referring to FIG. 5A, the control circuit 50a includes the first transistor M11 to the eighth transistor M18. The first transistor M11 to the fourth transistor M14 may be PFETs, and the fifth transistor M15 to the eighth transistor M18 may be NFETs. Each of the first transistor M11 to eighth transistor M18 may include a gate which receives one of the data input D, the inverted data input DB, the inverted reset signal RB, and the inverted set signal SB.

The first transistor M11 may receive the inverted data input DB, and the second transistor M12 may receive the inverted reset signal RB. The first transistor M11 and the second transistor M12 may be connected in series to each other between a first power node to which the positive supply voltage VDD is applied and an output node NO at which the bridge signal CB is generated. In some implementations, the first transistor M11 and the second transistor M12 may be connected in series to each other in an order different from that shown in FIG. 5A. The third transistor M13 may receive the data input D, and the fourth transistor M14 may receive the inverted set signal SB. The third transistor M13 and the fourth transistor M14 may be connected in series to each other between the first power node and the output node NO. In some implementations, the third transistor M13 and the fourth transistor M14 may be connected in series to each other in an order different from that shown in FIG. 5A.

The fifth transistor M15 may receive the inverted data input DB, and the sixth transistor M16 may receive the inverted set signal SB. The fifth transistor M15 and the sixth transistor M16 may be connected in series to each other between the output node NO and a second power node to which the negative supply voltage VSS is applied. In some implementations, the fifth transistor M15 and the sixth transistor M16 may be connected in series to each other in an order different from that shown in FIG. 5A. The seventh transistor M17 may receive the data input D, and the eighth transistor M18 may receive the inverted reset signal RB. The seventh transistor M17 and the eighth transistor M18 may be connected in series to each other between the output node NO and the second power node. In some implementations, the seventh transistor M17 and the eighth transistor M18 may be connected in series to each other in an order different from that shown in FIG. 5A.

Referring to FIG. 5B, the control circuit 50b includes first transistor M11 to the sixth transistor M16. The first transistor M11 and the second transistor M12 may be PFETs, and the third transistor M13 to the sixth transistor M16 may be NFETs. Each of the first transistor M11 to the sixth transistor M16 may include a gate which receives one of the data input D, the inverted data input DB, the inverted reset signal RB, and the inverted set signal SB.

The first transistor M11 may have a gate receiving the inverted reset signal RB, a source receiving the data input D, and a drain connected to the output node NO. The second transistor M12 may have a gate receiving the inverted set signal SB, a source receiving the inverted data input DB, and a drain connected to the output node NO. Compared to the control circuit 50a of FIG. 5A, the two PFETs may be omitted, and accordingly, the control circuit 50b may include a reduced number of transistors.

The third transistor M13 may receive the inverted data input DB, and the fourth transistor M14 may receive the inverted set signal SB. The third transistor M13 and the fourth transistor M14 may be connected in series to each other between the output node NO and the second power node to which the negative supply voltage VSS is applied. In some implementations, the third transistor M13 and the fourth transistor M14 may be connected in series to each other in an order different from that shown in FIG. 5B. The fifth transistor M15 may receive the data input D, and the sixth transistor M16 may receive the inverted reset signal RB. The fifth transistor M15 and the sixth transistor M16 may be connected in series to each other between the output node NO and the second power node. In some implementations, the fifth transistor M15 and the sixth transistor M16 may be connected in series to each other in an order different from that shown in FIG. 5B.

Figure 6:
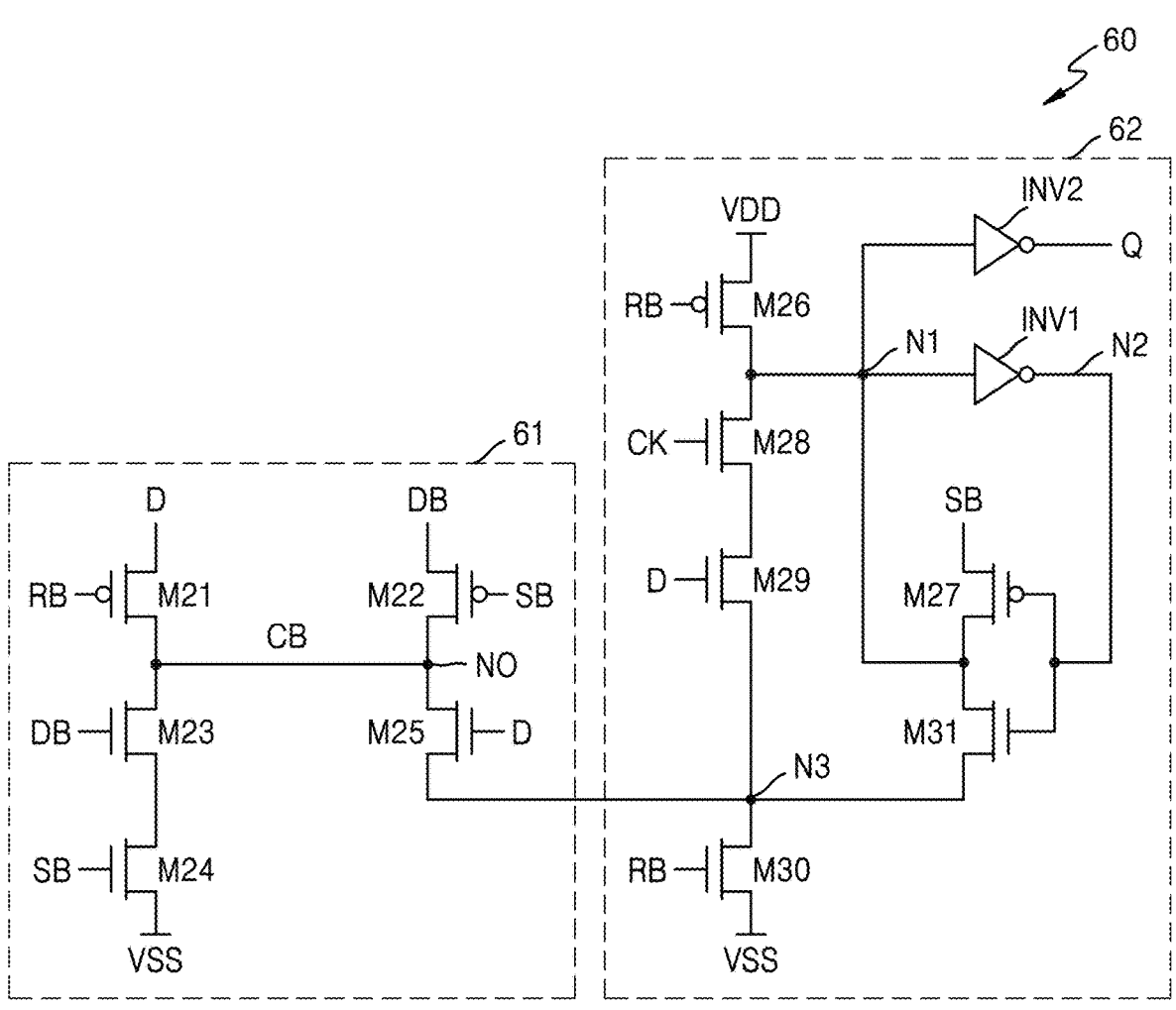
FIG. 6 is a circuit diagram illustrating a flip-flop according to some implementations.

FIG. 6 is a circuit diagram illustrating a flip-flop 60 according to some implementations. For example, the circuit diagram of FIG. 6 shows a control circuit 61 included in a first stage and a second stage 62 in the flip-flop 60. In some implementations, the control circuit 61 may share at least one transistor with the second stage 62, and accordingly, the flip-flop 60 may include a reduced number of transistors. It is noted that the control circuit 11_2 and the second stage 12 in FIG. 1 are not respectively limited to the control circuit 61 and the second stage 62 in FIG. 6.

Referring to FIG. 6, the control circuit 61 that generates the bridge signal CB at the output node NO includes a first transistor M21 to a fifth transistor M25. The first transistor M21 and the second transistor M22 may be PFETs, and the third transistor M23 to the fifth transistor M25 may be NFETs. Each of the first transistor M21 to the fifth transistor M25 may include a gate which receives one of the data input D, the inverted data input DB, the inverted reset signal RB, and the inverted set signal SB.

The first transistor M21 may have a gate receiving the inverted reset signal RB, a drain receiving the data input D, and a source connected to the output node NO. The second transistor M22 may have a gate receiving the inverted set signal SB, a drain receiving the inverted data input DB, and a source connected to the output node NO. In some implementations, the control circuit 61 may further include two PFETs between a first power node and the output node NO, as described above with reference to FIG. 5A.

The third transistor M23 may receive the inverted data input DB, and the fourth transistor M24 may receive the inverted set signal SB. The third transistor M23 and the fourth transistor M24 may be connected in series to each other between the output node NO and a second power node to which the negative supply voltage VSS is applied. In some implementations, the third transistor M23 and the fourth transistor M24 may be connected in series to each other in an order different from that shown in FIG. 6. The fifth transistor M25 may include the gate receiving the data input D, a drain connected to the output node NO, and a source connected to the second stage 62. As shown in FIG. 6, the source of the fifth transistor M25 may be connected to a drain, that is, a third node N3, of the tenth transistor M30 which receives the inverted reset signal RB at the second stage 62. Accordingly, compared to the control circuit 50b of FIG. 5B, the control circuit 61 may include a reduced number of transistors. Herein, a signal generated at the third node N3 by the second stage 62 may be referred to as an internal signal. For example, the second stage 62 may generate the internal signal based on at least one of the inverted reset signal RB and the inverted set signal SB. The control circuit 61 may generate the bridge signal CB based on the internal signal of the second stage 62 as well as the data input D, the inverted data input DB, the inverted reset signal RB, and the inverted set signal SB.

The second stage 62 may receive the data input D, the clock signal CK, the inverted reset signal RB, and the inverted set signal SB, and generate the data output Q. As shown in FIG. 6, the second stage 62 includes a sixth transistor M26 to an eleventh transistor M31, a first inverter INV1, and a second inverter INV2. Each of the first inverter INV1 and the second inverter INV2 may include a PFET and an NFET connected in series to each other between the first power node and the second power node. The sixth transistor M26 and the seventh transistor M27 may be PFETs, and the eighth transistor M28 to the eleventh transistor M31 may be NFETs.

The sixth transistor M26 may be connected between the first power node and the first node N1 corresponding to an inverted data output, and may include a gate which receives the inverted reset signal RB. The eighth transistor M28 may receive the clock signal CK, the ninth transistor M29 may receive the data input D, and the tenth transistor M30 may receive the inverted reset signal RB. The eighth transistor M28 to the tenth transistor M30 may be connected in series between the first node N1 and the second power node. A source of the ninth transistor M29 and a drain of the tenth transistor M30 may be connected at the third node N3, and as described above, the third node N3 may be connected to the source of the fifth transistor M25. In some implementations, the eighth transistor M28 and the ninth transistor M29 may be connected in series to each other between the first node N1 and the third node N3 in an order different from that shown in FIG. 6.

The first inverter INV1 may have an input connected to the first node N1 and an output connected to the second node N2. The seventh transistor M27 and the eleventh transistor M31 may constitute an inverter and have an input connected to the second node N2 and an output connected to the first node N1. That is, the inverter including the seventh transistor M27 and the eleventh transistor M31 may be cross-coupled with the first inverter INV1. As shown in FIG. 6, the seventh transistor M27 may include a source which receives the inverted set signal SB, and the eleventh transistor M31 may include a source connected to the third node N3. The second inverter INV2 may have the input connected to the first node N1 and may generate the data output Q.

Figure 7:
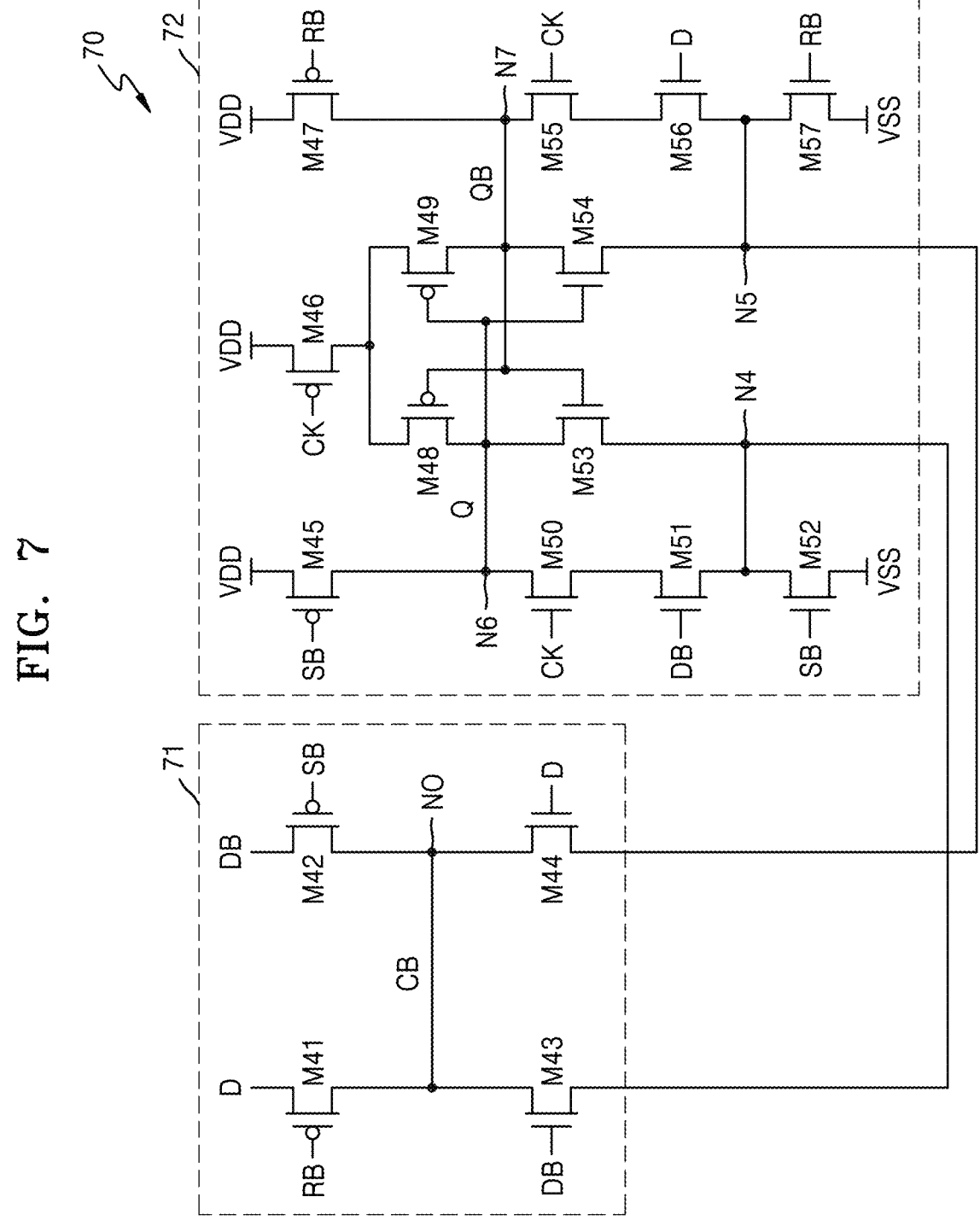
FIG. 7 is a circuit diagram illustrating a flip-flop according to some implementations.

FIG. 7 is a circuit diagram illustrating a flip-flop 70 according to some implementations. For example, the circuit diagram of FIG. 7 shows a control circuit 71 included in the first stage and a second stage 72 in the flip-flop 70 that is a differential type. In some implementations, the control circuit 71 may share at least one transistor with the second stage 72, and accordingly, the flip-flop 70 may include a reduced number of transistors. It is noted that the control circuit 11_2 and the second stage 12 in FIG. 1 are not respectively limited to the control circuit 71 and the second stage 72 in FIG. 7.

Referring to FIG. 7, the control circuit 71 that generates the bridge signal CB at the output node NO includes a first transistor M41 to a fourth transistor M44. The first transistor M41 and the second transistor M42 may be PFETs, and the third transistor M43 and the fourth transistor M44 may be NFETs. Each of first transistor M41 to the fourth transistor M44 may include a gate which receives one of the data input D, the inverted data input DB, the inverted reset signal RB, and the inverted set signal SB.

The first transistor M41 may have a gate receiving the inverted reset signal RB, a drain receiving the data input D, and a source connected to the output node NO. The second transistor M42 may have a gate receiving the inverted set signal SB, a drain receiving the inverted data input DB, and a source connected to the output node NO. In some implementations, the control circuit 71 may further include two PFETs between a first power node and the output node NO, as described above with reference to FIG. 5A.

The third transistor M43 may include a gate receiving the inverted data input DB, a drain connected to the output node NO, and a source connected to the second stage 72. As shown in FIG. 7, the source of the third transistor M43 may be connected to a drain, that is, a fourth node N4, of the twelfth transistor M52 which receives the inverted set signal SB at the second stage 72. The fourth transistor M44 may include a gate receiving the data input D, a drain connected to the output node NO, and a source connected to the second stage 72. As shown in FIG. 7, the source of the fourth transistor M44 may be connected to a drain, that is, a fifth node N5, of the seventeenth transistor M57 which receives the inverted reset signal RB at the second stage 72. Accordingly, compared to the control circuit 50b of FIG. 5B, the control circuit 71 may include a reduced number of transistors. Herein, signals generated by the second stage 72 at the fourth node N4 and the fifth node N5 may be referred to as internal signals. For example, the second stage 72 may generate the internal signal based on at least one of the inverted reset signal RB and the inverted set signal SB. The control circuit 71 may generate the bridge signal CB based on the internal signals of the second stage 72 as well as the data input D, the inverted data input DB, the inverted reset signal RB, and the inverted set signal SB.

The second stage 72 may receive the data input D, the clock signal CK, the inverted reset signal RB, and the inverted set signal SB, and generate the data output Q. As shown in FIG. 7, the second stage 72 includes a fifth transistor M45 to a seventeenth transistor M57. The fifth transistor M45 to the ninth transistor M49 may be PFETs, and the tenth transistor M50 to the seventeenth transistor M57 may be NFETs.

The fifth transistor M45 and the tenth transistor M50 to the twelfth transistor M52 may respectively receive the inverted set signal SB, the clock signal CK, the inverted data input DB, and the inverted set signal SB, and may be connected in series between the first power node and the second power node. As shown in FIG. 7, a drain of the fifth transistor M45 and a drain of the tenth transistor M50 may be connected to each other at a sixth node N6. In addition, a source of the eleventh transistor M51 and a drain of the twelfth transistor M52 may be connected to each other at the fourth node N4, and as described above, the fourth node N4 may be connected to the source of the third transistor M43 of the control circuit 71. In some implementations, the tenth transistor M50 and the eleventh transistor M51 may be connected in series to each other between the sixth node N6 and the fourth node N4 in an order different from that shown in FIG. 7.

The seventh transistor M47 and the fifteenth transistor M55 to the seventeenth transistor M57 may respectively receive the inverted reset signal RB, the clock signal CK, the data input D, and the inverted reset signal RB, and may be connected in series between the first power node and the second power node. As shown in FIG. 7, a drain of the seventh transistor M47 and a drain of the fifteenth transistor M55 may be connected to each other at a seventh node N7. A source of the sixteenth transistor M56 and a drain of the seventeenth transistor M57 may be connected to each other at the fifth node N5, and as described above, the fifth node N5 may be connected to the source of the fourth transistor M44 of the control circuit 71. In some implementations, the fifteenth transistor M55 and the sixteenth transistor M56 may be connected in series to each other between the seventh node N7 and the fifth node N5 in an order different from that shown in FIG. 7.

The eighth transistor M48, the ninth transistor M49, the thirteenth transistor M53, and the fourteenth transistor M54 may constitute two cross-coupled inverters between the sixth node N6 and the seventh node N7. The data output Q may be generated at the sixth node N6, and the inverted data output QB may be generated at the seventh node N7. The sixth transistor M46 may be connected between the first power node and the inverter and may receive the clock signal CK.

Figure 8:
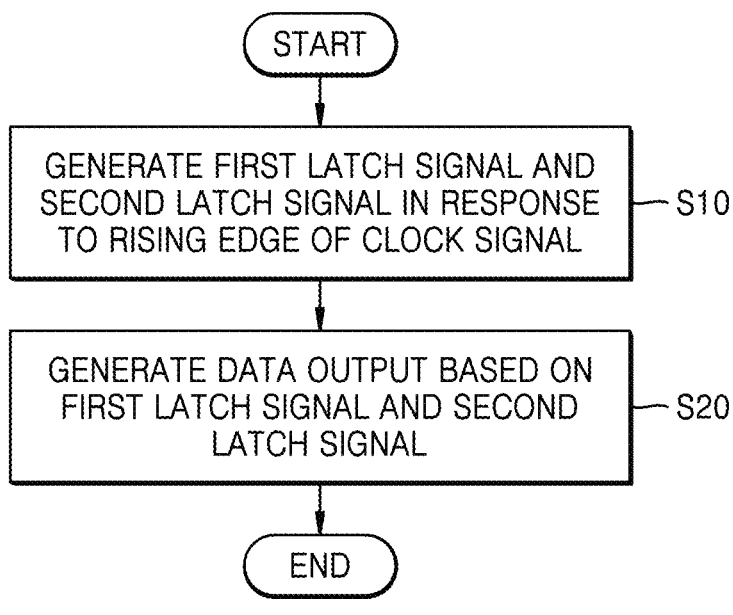
FIG. 8 is a flowchart illustrating an operation of a flip-flop according to some implementations.

FIG. 8 is a flowchart illustrating an operation of a flip-flop according to some implementations. Herein, the operation of FIG. 8 may be referred to as a method of generating the data output Q by latching the data input D based on the clock signal CK. As shown in FIG. 8, the method of generating the data output Q by latching the data input D based on the clock signal CK includes operations S10 and S20. In some implementations, the method of FIG. 8 may be performed by the flip-flop 10 of FIG. 1. Hereinafter, FIG. 8 will be described with reference to FIG. 1.

Referring to FIG. 8, the first latch signal L1 and the second latch signal L2 may be generated in response to a rising edge of the clock signal CK in operation S10. For example, the first stage 11 may sample the data input D at the rising edge of the clock signal CK, and the first latch signal L1 and the second latch signal L2 corresponding to a sampling result may be generated. As described above with reference to the drawings, the first stage 11 may generate the first latch signal L1 and the second latch signal L2 by pulling down a first pull-down node or a second pull-down node according to the data input D and the inverted data input DB at the rising edge of the clock signal CK. In addition, the first stage 11 includes the bridge circuit 11_1 and the control circuit 11_2 so that the data output Q is free from a change in the data input D during a hold period. An example of operation S10 will be described below with reference to FIG. 9.

In operation S20, the data output Q may be generated based on the first latch signal L1 and the second latch signal L2. For example, the second stage 12 may receive the first latch signal L1 and the second latch signal L2 generated in operation S10, and generate the data output Q based on the first latch signal L1 and the second latch signal L2. In some implementations, as described above with reference to FIG. 2, the second stage 12 may include an SR latch, and first latch signal L1 and second latch signal L2 may respectively correspond to the inverted reset signal RB, and the inverted set signal SB. Accordingly, the second stage 12 may generate the data output Q that is 1 in response to the activated first latch signal L1 and the deactivated second latch signal L2. The second stage 12 may generate the data output Q that is 0 in response to the deactivated first latch signal L1 and the activated second latch signal L2. In addition, the second stage 12 may hold the data output Q in response to the activated first latch signal L1 and the activated second latch signal L2.

Figure 9:
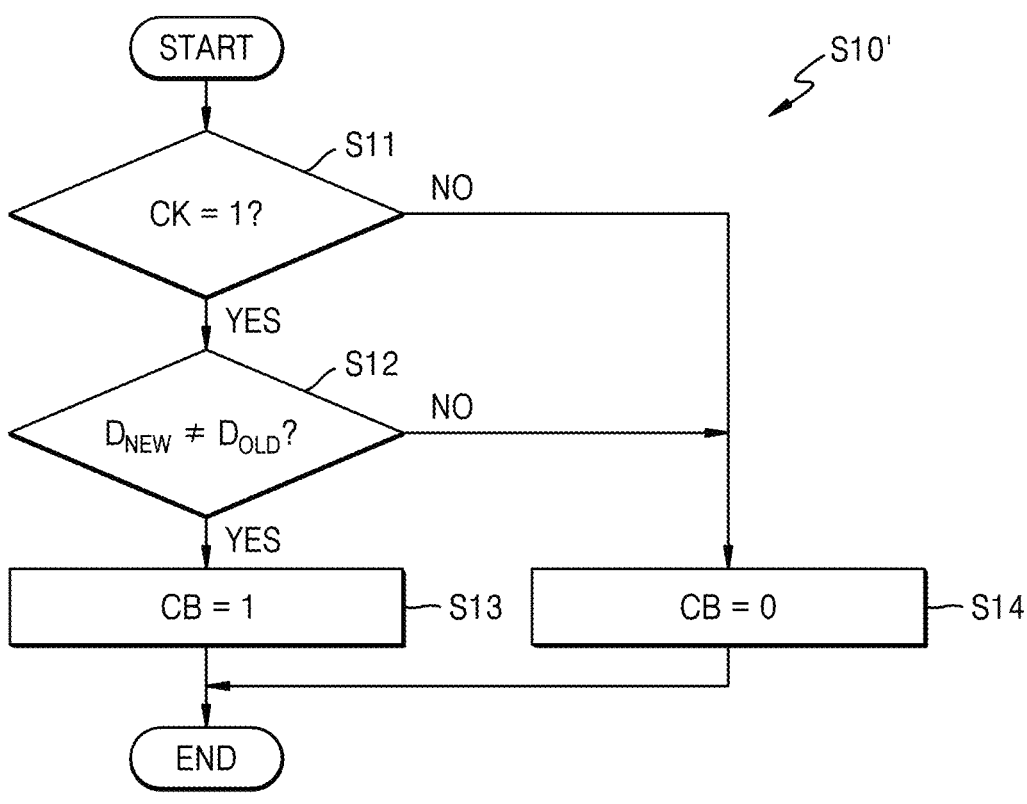
FIG. 9 is a flowchart illustrating an operation of a flip-flop according to some implementations.

FIG. 9 is a flowchart illustrating an operation of a flip-flop according to some implementations. For example, the flow chart in FIG. 9 shows an example of operation S10 in FIG. 8. As described above with reference to FIG. 8, the first latch signal L1 and the second latch signal L2 may be generated in response to a rising edge of the clock signal CK in operation S10' of FIG. 9. As shown in FIG. 9, operation S10' includes a plurality of operations S11 to S14. In some implementations, operation S10' of FIG. 9 may be performed by the control circuit 32 of FIG. 3. Hereinafter, FIG. 9 will be described with reference to FIG. 3.

Referring to FIG. 9, it may be determined whether the clock signal CK is 1 in operation S11. For example, the first stage 30 may generate the inverted reset signal RB and the inverted set signal SB that are precharged to 1 when the clock signal CK is 0, and complementarily generate the inverted reset signal RB and the inverted set signal SB when the clock signal CK is 1. Accordingly, the control circuit 32 may identify that the clock signal CK is 1 when the inverted reset signal RB and the inverted set signal SB are complementary to each other. As shown in FIG. 9, when the clock signal CK is 1, operation S12 may be performed subsequently, while when the clock signal CK is not 1, operation S14 may be performed subsequently.

When the clock signal CK is 1, it may be determined in operation S12 whether new data input $D_{NEW}$ is different from an existing data input $D_{OLD}$. That is, a transition of the data input D may be detected. In one embodiment, when the clock signal CK is 1, the transition of the data input D may be detected based on the data input D, the inverted data input DB, the inverted reset signal RB and the inverted set signal SB. In one embodiment, when the clock signal CK is 1, the transition of the data input D may be detected based on the data input D, the inverted data input DB, the inverted reset signal RB, the inverted set signal SB and the internal signal generated by the second stage (e.g., the second stage 62 or the second stage 72). For example, the control circuit 32 may receive the data input D and the inverted data input DB, and while the clock signal CK is 1, the control circuit 32 may detect transitions of the data input D and the inverted data input DB when the clock signal CK is 1. As shown in FIG. 9, operation S13 may be performed subsequently when the transitions of the data input D and the inverted data input DB are detected, while operation S14 may be performed subsequently when the transitions of the data input D and the inverted data input DB are not detected.

When the transitions of the data input D and the inverted data input DB occur while the clock signal CK is 1, the bridge signal CB may be activated in operation S13. For example, the control circuit 32 may generate the deactivated bridge signal CB which is, e.g., 0, according to the data input D, the inverted reset signal RB, and the inverted set signal SB, whereas when the transition of the data input D occurs, generate the activated bridge signal CB which is, e.g., 1, according to the transitioned data input D, the inverted reset signal RB, and the inverted set signal SB. The bridge circuit 31 may electrically connect the first pull-down node NA1 and the second pull-down node NA2 to each other in response to the activated bridge signal CB, and, as described above with reference to FIG. 4, the inverted reset signal RB and the inverted set signal SB may be held despite the transition of the data input D.

In operation S14, the bridge signal CB may be deactivated. The bridge circuit 31 may electrically disconnect the first pull-down node NA1 and the second pull-down node NA2 from each other in response to the deactivated bridge signal CB. As described above, operation S14 may be performed when the clock signal CK is 0 or when the transition of the data input D does not occur while the clock signal CK is 1. For example, when the clock signal CK is 0, the control circuit 32 may generate the bridge signal CB that is 0 regardless of the data input D according to the inverted reset signal RB and the inverted set signal SB that are precharged to 1. In addition, the control circuit 32 may hold the deactivated bridge signal CB while the clock signal CK is 0 when the transition of the data input D does not occur while the clock signal CK is 1. Accordingly, when the clock signal CK is 0 or when the transition of the data input D does not occur while the clock signal CK is 1, the first pull-down node NA1 and the second pull-down node NA2 may be electrically disconnected from each other.

Figure 10:
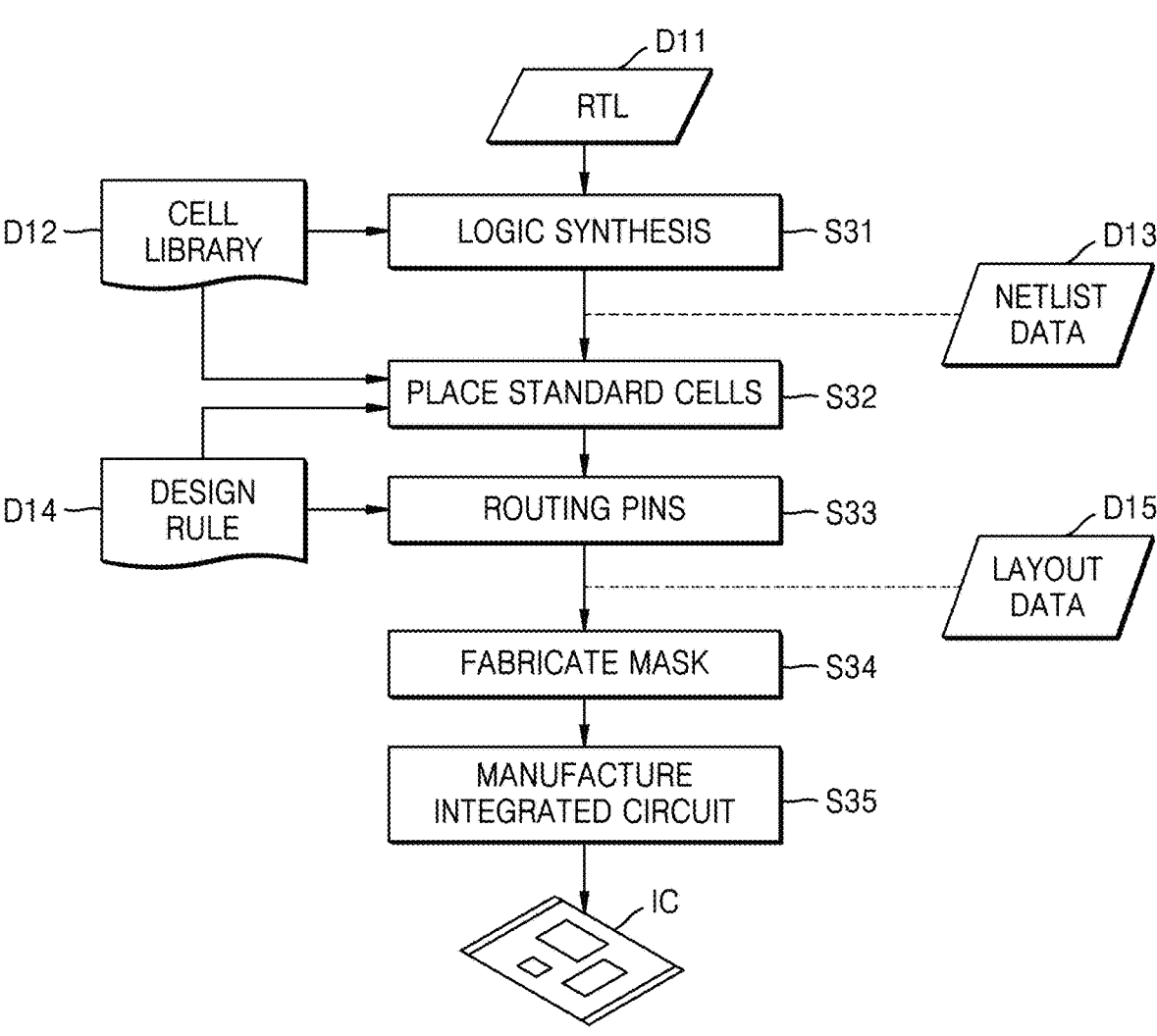
FIG. 10 is a flowchart illustrating a method of manufacturing an integrated circuit according to some implementations.

FIG. 10 is a flowchart illustrating a method of manufacturing an integrated circuit (IC) according to some implementations. Specifically, the flowchart of FIG. 10 shows an example of the method of manufacturing the IC including standard cells. A standard cell is a unit of layout included in the IC and may be designed to perform a predefined function. As shown in FIG. 10, the method of manufacturing the IC includes a plurality of operations S31 to S35.

A cell library (or standard cell library) D12 may include information about standard cells, such as information about functions, characteristics, layout, etc. In some implementations, the flip-flop described above with reference to the figures, that is, the SAFF, may be included in the IC as the standard cell. For example, the cell library D12 may include information about cells corresponding to the flip-flop described above with reference to the drawings. Accordingly, the IC may have a high operating speed, reduced power consumption, and a high operating reliability.

A design rule D14 may include requirements which the layout of IC needs to comply with. For example, the design rule D14 may include requirements of spaces between patterns in the same layer, the minimum width of the pattern, a routing direction of a wiring layer, etc. In some implementations, the design rule D14 may define the minimum separation distance within the same track of the wiring layer.

In operation S31, a logical synthesis operation may be performed to generate netlist data D13 from RTL (a register-transfer level) data D11. For example, a semiconductor design tool (e.g., a logic synthesis tool) may perform synthesizes logic by referencing the cell library D12 from the RTL data D11 written in a VHSIC Hardware Description Language (VHDL) and a Hardware Description Language (HDL) such as Verilog, and generate the netlist data D13 including a bitstream or netlist. The netlist data D13 may correspond to an input of place and routing, which will be described below.

In operation S32, the standard cells may be placed. For example, the semiconductor design tool (e.g., place and route (P&R) tool) may place the standard cells used in the netlist data D13 with reference to the cell library D12. In some implementations, the semiconductor design tool may place the standard cells in rows extending parallel to each other, and the placed standard cells may receive power from a power rail extending along boundaries of the rows.

In operation S33, pins of the standard cells may be routed. For example, the semiconductor design tool may generate interconnections that electrically connect output pins and input pins of the placed standard cells, and generate layout data D15 defining the placed standard cells and the generated interconnections. The interconnection may include a via of a via layer and/or patterns of wiring layers. In some implementations, the wiring layers may include a front side wiring layer located above a gate electrode as well as a backside wiring layer located below the gate electrode. The layout data D15 may have, for example, a format such as GDSII and may include geometric information of the cells and the interconnections. The semiconductor design tool may refer to the design rule D14 while routing the pins of the cells. The layout data D15 may correspond to an output of place and routing. Operation S33 alone, or operations S32 and S33 collectively, may be referred to as a method of designing the IC.

In operation S34, a mask may be fabricated. For example, optical proximity correction (OPC) to correct distortion such as refraction due to the characteristics of light in photolithography may be applied to the layout data D15. Patterns on the mask may be defined to form patterns placed on a plurality of layers based on the OPC applied data, and at least one mask (or photomask) may be fabricated to form the patterns of each of the plurality of layers. In some implementations, the layout of the IC may be limitedly modified in operation S34, and limitedly modifying the IC in operation S34 may be referred to as design polishing as postprocessing for optimizing a structure of the IC.

In operation S35, the IC may be manufactured. For example, the IC may be manufactured by patterning the plurality of layers using the at least one mask fabricated in operation S34. A front-end-of-line (FEOL) may include, for example, planarizing and cleaning a wafer, forming a trench, forming a well, forming a gate electrode, and forming a source and a drain. By the FEOL, individual elements such as transistors, capacitors, resistors, etc. may be formed on a substrate. In addition, a back-end-of-line (BEOL) may include, for example, siliciding gate, source, and drain regions, adding a dielectric, planarizing the dielectric, forming holes, adding a metal layer, forming a via, and forming a passivation layer, etc. By the BEOL, individual elements such as transistors, capacitors, resistors, etc. may be interconnected. In some implementations, a middle-of-line (MOL) may be performed between the FEOL and the BEOL and contacts may be formed on the individual elements. Thereafter, the IC may be packaged in a semiconductor package and used as a component in a variety of applications.

Figure 11:
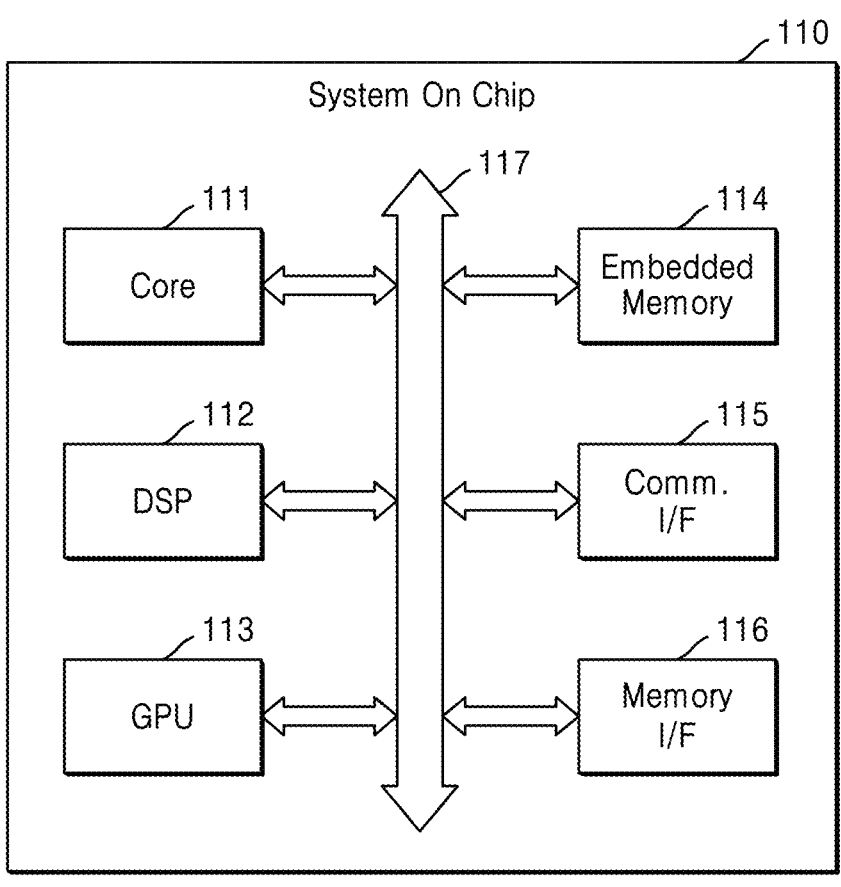
FIG. 11 is a block diagram illustrating a system-on-chip according to some implementations.

FIG. 11 is a block diagram illustrating a system-on-chip (SoC) 110 according to some implementations. The SoC 110 may refer to an IC that integrates components of a computing system or other electronic system. For example, an application processor (AP) as an example of the SoC 110 may include a processor and components for other functions. As shown in FIG. 11, the SoC 110 includes a core 111, a digital signal processor (DSP) 112, a graphics processing unit (GPU) 113, an embedded memory 114, a communication interface (I/F) 115, and a memory interface 116. The components of the SoC 110 may communicate with each other through a bus 117.

The components of the SoC 110 may include the flip-flops described above with reference to the drawings. Accordingly, the components may each have a high operating speed, reduced power consumption, and a high operating reliability, and as a result, the performance, efficiency, and reliability of the SoC 110 may be improved.

The core 111 may process instructions and control operations of the components included in the SoC 110. For example, the core 111 may drive an operating system and run applications on the operating system by processing a series of instructions. The DSP 112 may generate useful data by processing a digital signal, for example, a digital signal provided from the communication interface 115. The GPU 113 may generate data for an image output through a display device from image data provided from the embedded memory 114 or the memory interface 116, and may encode the image data. The embedded memory 114 may store data necessary for the core 111, the DSP 112, and the GPU 113 to operate. The communication interface 115 may provide an interface for a communication network or one-to-one communication. The memory interface 116 may provide an interface to an external memory of the SoC 110, such as dynamic random-access memory (DRAM) and flash memory.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While the disclosure has been particularly shown and described with reference to some implementations thereof, it will be understood that various changes in form and details may be made therein without departing from the spirit and scope of the following claims.

What is claimed is:

1. A sense amplifier flip-flop comprising:
a first stage configured to generate, in response to a rising edge of a clock signal, a first latch signal and a second latch signal by pulling down a first pull-down node or a second pull-down node according to a data input and an inverted data input; and
a second stage configured to generate a data output based on the first latch signal and the second latch signal,
wherein the first stage comprises:
a bridge circuit configured to electrically connect the first pull-down node and the second pull-down node to each other in response to activation of a bridge signal; and
a control circuit configured to activate the bridge signal when the data input transitions while the clock signal is logic high.

2. The sense amplifier flip-flop of claim 1, wherein the control circuit is configured to deactivate the bridge signal based on the data input not transitioning while the first latch signal and the second latch signal are complementary to each other.

3. The sense amplifier flip-flop of claim 1, wherein the control circuit is configured to deactivate the bridge signal while the first latch signal and the second latch signal are precharged.

4. The sense amplifier flip-flop of claim 1, wherein the control circuit is configured to generate the bridge signal based on the data input, the inverted data input, the first latch signal, and the second latch signal.

5. The sense amplifier flip-flop of claim 1, wherein the control circuit comprises:
a first p-channel field effect transistor (PFET) and a second PFET connected in series to each other between a first power node to which a positive supply voltage is applied and an output node at which the bridge signal is generated, wherein the first PFET is configured to receive the inverted data input and the second PFET is configured to receive the first latch signal; and
a third PFET and a fourth PFET connected in series to each other between the first power node and the output node, wherein the third PFET is configured to receive the data input and the fourth PFET is configured to receive the second latch signal.

6. The sense amplifier flip-flop of claim 1, wherein the control circuit comprises:
a first PFET including a source configured to receive the data input, a drain connected to an output node at which the bridge signal is generated, and a gate configured to receive the first latch signal; and
a second PFET including a source configured to receive the inverted data input, a drain connected to the output node, and a gate configured to receive the second latch signal.

7. The sense amplifier flip-flop of claim 1, wherein the control circuit comprises:
a first n-channel field effect transistor (NFET) and a second NFET connected in series to each other between an output node at which the bridge signal is generated and a second power node to which a negative supply voltage is applied, wherein the first NFET is configured to receive the inverted data input and the second NFET is configured to receive the second latch signal; and
a third NFET and a fourth NFET connected in series to each other between the output node and the second power node, wherein the third NFET is configured to receive the data input and the fourth NFET is configured to receive the first latch signal.

8. The sense amplifier flip-flop of claim 1,
wherein the control circuit comprises:
a first NFET and a second NFET connected in series to each other between an output node at which the bridge signal is generated and a second power node to which a negative supply voltage is applied, wherein the first NFET is configured to receive the inverted data input and the second NFET is configured to receive the second latch signal; and
a third NFET including a drain connected to the output node and a gate configured to receive the data input, and
wherein the second stage comprises:
a fourth NFET including a source connected to a second power node to which a negative supply voltage is applied, a gate configured to receive the first latch signal, and a drain connected to a source of the third NFET; and
at least one transistor connected to the drain of the fourth NFET.

9. The sense amplifier flip-flop of claim 1, wherein the control circuit comprises:
a first NFET including a drain connected to an output node at which the bridge signal is generated and a gate configured to receive the inverted data input; and a second NFET including a drain connected to the output node and a gate configured to receive the data input, and the second stage comprises:

a third NFET including a source connected to a second power node to which a negative supply voltage is applied, a gate configured to receive the second latch signal, and a drain connected to a source of the first NFET;

a fourth NFET including a source connected to the second power node, a gate configured to receive the first latch signal, and a drain connected to a source of the second NFET;

at least one transistor connected to the drain of the third NFET; and at least one transistor connected to the drain of the fourth NFET.

10. The sense amplifier flip-flop of claim 1, wherein the bridge circuit includes a first n-channel field effect transistor including a source connected to the first pull-down node, a drain connected to the second pull-down node and a gate configured to receive the bridge signal.

11. The sense amplifier flip-flop of claim 1, wherein the second stage is configured to:

generate the data output that is logic high in response to activation of the first latch signal and deactivation of the second latch signal; and generate the data output that is a logic low in response to deactivation of the first latch signal and activation of the second latch signal.

12. A sense amplifier flip-flop comprising:

a first stage configured to generate, in response to a rising edge of a clock signal, a first latch signal and a second latch signal by pulling down a first pull-down node or a second pull-down node according to a data input and an inverted data input; and a second stage configured to generate a data output based on the first latch signal and the second latch signal, wherein the first stage is configured to electrically connect the first pull-down node and the second pull-down node to each other based on the data input being transitioned while the clock signal is logic high, and wherein the first stage is configured to electrically disconnect the first pull-down node and the second pull-down node from each other based on the data input not transitioning while the clock signal is logic high.

13. The sense amplifier flip-flop of claim 12, wherein the first stage is configured to electrically disconnect the first pull-down node and the second pull-down node from each other while the clock signal is logic low.

14. The sense amplifier flip-flop of claim 12, wherein the first stage is configured to, based on the data input, the inverted data input, the first latch signal, and the second latch signal, detect a transition of the data input while the clock signal is logic high.

15. The sense amplifier flip-flop of claim 12, wherein the second stage is configured to generate at least one internal signal based on at least one of the first latch signal or the second latch signal, and the first stage is configured to, based on the data input, the inverted data input, the first latch signal, the second latch signal, and the at least one internal signal, detect a transition of the data input while the clock signal is logic high.

16. A method of generating a data output by latching a data input based on a clock signal, the method comprising:

generating, in response to a rising edge of the clock signal, a first latch signal and a second latch signal by pulling down a first pull-down node or a second pull-down node according to the data input and an inverted data input; and generating the data output based on the first latch signal and the second latch signal, wherein the generating of the first latch signal and the second latch signal comprises detecting a transition of the data input while the clock signal is logic high; and electrically connecting the first pull-down node and the second pull-down node to each other when the transition of the data input is detected.

17. The method of claim 16, further comprising: electrically disconnecting the first pull-down node and the second pull-down node from each other based on the data input not transitioning while the clock signal is logic high.

18. The method of claim 16, further comprising: electrically disconnecting the first pull-down node and the second pull-down node from each other while the clock signal is logic low.

19. The method of claim 16, wherein the detecting of the transition of the data input includes detecting the transition of the data input based on the data input, the inverted data input, the first latch signal, and the second latch signal.

* * * * *